United States Patent Office 3,679,439

Patented July 25, 1972

3,679,439
LEAD-CONTAINING METALLIZATIONS

Alvin A. Milgram, Wilmington, Del., assignor to E. I. du Pont de Nemours and Company, Wilmington, Del.

No Drawing. Continuation-in-part of abandoned application Ser. No. 829,141, May 29, 1969. This application Mar. 23, 1971, Ser. No. 127,342
Int. Cl. C09d 5/24
U.S. Cl. 106—1 11 Claims

ABSTRACT OF THE DISCLOSURE

Metallizing compositions, for producing fired-on coatings which have good electrical properties, comprising noble metals, an inorganic binder and 1–25% by weight of lead. The metallic lead is added to the metallizing composition to provide a fired metallization that has solder wetability and increased solder leach resistance. The metallizing composition are used to form electrodes, microcircuitry and other related articles in the electronic industry.

REFERENCE TO RELATED APPLICATION

This application is a continuation-in-part of my copending application S.N. 829,141, filed May 29, 1969, now abandoned.

BACKGROUND OF THE INVENTION

Metallizing compositions or paints used in metallizing ceramic surfaces for electrical purposes must be fired on the surfaces at a temperature sufficiently high to produce good adhesion, good capacitance and a low dissipation factor. In addition, the fired-on metallizations must be readily solderable to electrical lead wires or other metallic connectors (i.e., have solder wettability); the metallizations must have good solder leach resistance when exposed to molten solder.

While some metallizations provide fired-on coatings which meet most of the above requirements, there is a need for a metallizing composition which can be fired on various substrates to provide all of the above properties, including solder wettability and resistance to solder leaching. Therefore, it is the object of this invention to provide an improved metallization which possesses the common desirable electrical properties, is wet by solder and resistant to solder leaching.

SUMMARY OF THE INVENTION

This invention relates to metallizing compositions which produce fired-on coatings having good electrical properties. The compositions comprise noble metal, inorganic binder and from 1–25% by weight of lead. These metallizing compositions may be dispersed in an inert liquid vehicle, applied to substrates and fired to form coatings which have good solder wettability and increased solder leach resistance.

DETAILED DESCRIPTION

As described above, the metallizing compositions contain noble metal. The term "noble metal" includes platinum, palladium, silver, gold, ruthenium, osmium, rhodium, iridium, alloys thereof and mixtures thereof. For purposes of this invention, the amount of noble metal is not critical. The noble metal content can be varied according to the desired conductivity and/or resistivity. Furthermore, the percent solids (metals and inorganic binder) in the metallizing composition can be modified to suit the particular application which is involved. Metallizing compositions generally are of such a particle size that they can be applied by screen printing techniques. Typically, metallizing compositions, including those of this invention which include lead, are of a size small enough to pass through a screen in the size range No. 200–No. 400 (U.S. standard seive scale), as indicated in the art, e.g., Miller U.S. Pat. 3,374,110.

The metallizing compositions also contain an inorganic binder. Any inorganic material which serves to bind metals to the substrate can be used as the inorganic binder component. The amount of inorganic binder present should always be sufficient to provide adequate adhesion of the metals to the substrate. The inorganic binder can be any of the glass frits employed in metallizing compositions. Such frits are generally prepared by melting a glass batch of desired metal oxides, or compound which will produce the glass during melting, and pouring the melt into water. The coarse frit is then milled to a power of the desired fineness. The patents to Larsen and Short, U.S. Pat. No. 2,822,279 and to Hoffman, U.S. Pat. No. 3,207,706, describe some frit compositions which can be employed. Typical frit compositions usable as binders in the compositions of this invention include: lead borate, lead silicate, lead borosilicate, cadmium borate, lead-cadmium borosilicate, zinc borosilicate and sodium-cadmium borosilicate frits. The glass frit may be used alone, or together with a wetting agent such as $Bi_2O_3$. It is pointed out that the presence of metallic lead eliminates the need for a wetting agent. Consequently, a wetting agent is an optional constituent in the metallizing compositions of this invention.

The important feature of this invention is the inclusion of 1–25% by weight of lead to the metallizing compositions. The lead can be in the form of metallic lead or any precursor which will yield metallic lead upon firing. It has been discovered that when the metallizing compositions are applied to a substrate and fired, the resulting fired-on metallization coating can be wet by solder but also resistant to solder leaching. In addition, the coating possesses all of the other desirable electrical characteristics including good adhesion, good capacitance and low dissipation factor. The lower limit on lead content of 1% has been set for reasons of practicality. The presence of any amount of lead improved the solder leach resistance. However, for practical reasons, about 1% is necessary to show signifiant improvements. The 25% upper limit has been set for reasons of operability. If too much lead is present, the fired-on metallization will not be properly wet by solder (i.e., poor solder wettability). It has also been observed that as the amount of noble metal increases in the metallizing composition, the amount of lead can also be increased. Consequently, in some cases where large amounts of noble metal are used, more than 25% lead may be used and still obtain the desirable result. However, the preferred amount of lead is within the range of 1–15%. It has been found that where the noble metal is silver, 3–12% of lead is preferred due to a good balance of solder wettability and solder leach resistance in that range.

The metallizing compositions of this invention will usually, although not necessarily, be dispersed in an inert liquid vehicle to form a paint or paste for application to ceramic dielectric substrates. The proportion of vehicle: solids may vary considerably upon the manner in which the paint or paste is to be applied and the kind of vehicle used. Any liquid, preferably one that is inert towards the noble metal and inorganic binder, may be employed as the vehicle. Water or any of the various organic liquids, with or without resin binders, thickening and/or stabilizing agents, and/or other common additives may be utilized as the vehicle. Examples of organic liquids that can be used are esters of higher alcohols, for example, the acetates and propionates; the terpenes such as pine oil, alpha- and beta-terpineol and the like; and solutions of resin binders such as the polymethacrylates of lower alcohols, or solutions of ethyl cellulose, and solvents such as pine oil and the monobutyl ether of ethylene glycol monoacetate (butyl-O-$CH_2CH_2$-$OCOCH_3$). Vehicles disclosed in commonly assigned copending application (PC 3428–A), Ser. No. 828,346, filed May 27, 1969, may be used (now U.S. Pat. 3,536,508). The vehicle may contain or be composed of volatile liquids to promote fast setting after application: or it may contain waxes, thermoplastic resins or the like materials which are thermofluid so that the vehicle-containing composition may be applied at an elevated temperature to a relatively cold ceramic body upon which the composition sets immediately.

The metallizing compositions can be applied and fired onto various types of ceramic dielectrics, including those composed of forsterite, steatite, titanium oxide, barium titanate, alumina or zircon porcelain. Any other conventional unfired (green) dielectrics or prefired dielectrics can be used. The metallizing compositions can be applied by any of the conventional techniques, including screen printing, brushing, brush/band, spraying or dipping.

The invention is further illustrated by the following examples. In the examples and elsewhere in the specification all parts, ratios and percentages of material or components are by weight.

EXAMPLE 1

As a comparative showing, a conventional metallization was prepared, printed on a substrate and fired for the purpose of comparing the results with the present invention. The conventional metallizing composition contained 85% silver and 15% inorganic binder (4 parts $Bi_2O_3$ and 1 part of a glass containing 50% CdO, 13% $B_2O_3$, 12% $SiO_2$, 22% NaO and 3% $Al_2O_3$) dispersed in an inert liquid vehicle. The vehicle consisted of 92% beta-terpineol and 8% ethyl cellulose. The ratio of solids:vehicle was 7:3. This metallizing composition was screen printed onto a titanium dioxide substrate and fired at 760° C. The coated substrate was fluxed and dip-soldered at 215° C. in a molten solder bath containing 62% tin, 36% lead and 2% silver. The solder wettability, adhesion and capacitance were good and the dissipation factor was low. However, the metallization was leached by the solder bath within 30 seconds.

EXAMPLE 2

The procedure of Example 1 was carried out except that the metallizing composition used was a composition in accordance with this invention. The metallizing composition contained 85% silver, 3% inorganic binder (a glass frit containing 50% CdO, 13% $B_2O_3$, 12% $SiO_2$, 22% NaO and 3% $Al_2O_3$) and 12% finely divided lead dispersed in the same inert liquid vehicle. This metallizing composition was screen printed onto a titanium dioxide substrate and fired at 680° C. The coated substrate was fluxed and dip-soldered at 215° C. in a molten solder bath containing 62% tin, 36% lead and 2% silver. The solder wettability, adhesion and capacitance were good and the dissipation factor was low. However, the metallization was not leached until it was present in the solder bath for 80 seconds. Thus, the metallizations of this invention have increased solder leach resistance. Also, there was no need for a wetting agent such as $Bi_2O_3$ to provide good solder wettability.

EXAMPLE 3

The performances of lead and nickel as additives to metallizing compositions were compared in terms of solder bath life and solder wettability. The procedure of Example 1 was used, except as follows.

The lead composition contained 62 parts silver, 2.25 parts of the glass frit of Example 1, 2.5 parts $Bi_2O_3$ and 3.3 parts lead (88.5% Ag, 3.2% frit, 3.6% $Bi_2O_3$ and 4.7% Pb). The vehicle and the ratio of solids to vehicle were as in Example 1. The fired product exhibited fair solder wettability and a 30-second solder bath life.

A comparative run in which nickel was substituted for lead exhibited for solder wettability and a 15-second solder bath life.

EXAMPLE 4

The performances of lead and nickel as additives to metallizing compositions were compared in terms of solder wettability. The procedure of Example 1 was used, except as follows.

The lead composition contained 6.539 parts silver, 0.238 part of the glass frit of Example 1, 0.212 part $Bi_2O_3$, and 0.212 part lead (90.8% Ag, 3.3% frit, 2.95% $Bi_2O_3$ and 2.95% Pb); 2.8 parts of the vehicle of Example 1 were used.

The nickel composition was the same except that nickel was substituted for lead.

The solder bath contained 59% tin, 39% lead and 2% silver. The substrate was alumina rather than titania. Solder wettability performance was as follows.

| | Solder wettability at— | | | | |
|---|---|---|---|---|---|
| | 5 sec. | 10 sec. | 15 sec. | 20 sec. | 25 sec. |
| Composition: | | | | | |
| Pb | e | g–e | f–g | f | p–f |
| Ni | f | p–f | ------ | ------ | ------ |

NOTE.—e is excellent, g is good, f is fair, p is poor.

Although not intended to be limiting, it is thought by those skilled in the art that the performance of lead as a metallization additive is superior to that of nickel due to a difference in the chemistry of lead and nickel. Lead may oxidize to the oxide on firing and become part of the glassy binder system. Thus, a reactive glass may be formed, which can be attacked by rosin acids so that the silver metal is fluxed for soldering. On the other hand, nickel, although it may oxidize and combine to some extent with the glassy binder, does not produce the same type of chemically sensitive glassy binder.

I claim:

1. In a metallizing composition for producing fired-on coatings having good electrical properties, said composition comprising one or more noble metals and a glass frit, the improvement comprising the presence of 1–25% by weight of finely divided lead, so as to provide a metallizing composition which produces fired-on coatings that have good solder wettability and increased solder leach resistance.

2. A metallizing composition according to claim 1 wherein the noble metal is silver or an alloy thereof with one or more other noble metals.

3. A metallizing composition according to claim 2 wherein the noble metal is silver.

4. A metallizing composition according to claim 1 comprising 1–15% of finely divided lead.

5. A metallizing composition according to claim 4 wherein the noble metal is silver or an alloy thereof with one or more other noble metals.

6. A metallizing composition according to claim 5 wherein the noble metal is silver.

7. A metallizing composition according to claim 6 comprising 3–12% of finely divided lead.

8. A ceramic substrate having the metallizing composition of claim 1 in adherent relationship thereto.

9. A ceramic substrate having the metallizing composition of claim 2 in adherent relationship thereto.

10. A ceramic substrate having the metallizing composition of claim 4 in adherent relationship thereto.

11. A ceramic substrate having the metallizing composition of claim 7 in adherent relationship thereto.

References Cited

UNITED STATES PATENTS

| | | | |
|---|---|---|---|
| 3,374,110 | 3/1968 | Miller | 106—1 X |
| 3,484,284 | 12/1969 | Dates et al. | 106—1 X |

LORENZO B. HAYES, Primary Examiner

U.S. Cl. X.R.

117—123 B, 124 C, 227; 252—514